United States Patent [19]

Bradley

[11] Patent Number: 5,023,944
[45] Date of Patent: Jun. 11, 1991

[54] OPTICAL RESONATOR STRUCTURES

[75] Inventor: Eric M. Bradley, San Diego, Calif.

[73] Assignee: General Dynamics Corp./Electronics Division, San Diego, Calif.

[21] Appl. No.: 402,508

[22] Filed: Sep. 5, 1989

[51] Int. Cl.$^5$ .................. G02F 1/00; H01L 33/00; G02B 27/10

[52] U.S. Cl. .................. 455/611; 357/17; 358/226; 350/316

[58] Field of Search ............... 357/17, 19; 455/609–611, 613; 358/226; 350/313, 316

[56] References Cited

U.S. PATENT DOCUMENTS

| | | | |
|---|---|---|---|
| 3,471,802 | 10/1969 | Caulfield | 331/94.5 |
| 3,549,236 | 12/1970 | Mink | 350/157 |
| 3,622,911 | 11/1971 | Marcatili | 331/94.5 |
| 3,656,836 | 4/1972 | de Cremoux et al. | 350/160 |
| 3,766,393 | 10/1973 | Herzog et al. | 250/199 |
| 3,813,605 | 5/1974 | Szoke | 330/4.3 |
| 3,930,718 | 1/1976 | Jensen | 350/160 |
| 3,982,207 | 9/1976 | Dingle et al. | 331/94.5 |
| 4,009,453 | 2/1977 | Mahlein | 331/94.5 |
| 4,023,993 | 5/1977 | Scifres et al. | 148/172 |
| 4,024,466 | 5/1977 | Cremosnik | 331/94.5 |
| 4,115,747 | 9/1978 | Sato et al. | 331/94.5 |
| 4,196,396 | 4/1980 | Smith | 330/4.3 |
| 4,233,569 | 11/1980 | Liu | 331/94.5 |
| 4,240,696 | 12/1980 | Tracy et al. | 350/163 |
| 4,269,481 | 5/1981 | Yeh et al. | 350/356 |
| 4,274,706 | 6/1981 | Tangonan | 350/96.19 |
| 4,318,059 | 3/1982 | Lang et al. | 372/47 |
| 4,328,468 | 5/1982 | Krawczak et al. | 372/97 |
| 4,395,769 | 7/1983 | Damen et al. | 372/7 |
| 4,438,447 | 3/1984 | Copeland, III et al. | 357/19 |
| 4,498,179 | 2/1985 | Wayne et al. | 372/27 |
| 4,503,447 | 3/1985 | Iafrate et al. | 357/16 |
| 4,504,950 | 3/1985 | AuYeung | 372/20 |
| 4,532,632 | 7/1985 | Yamashita et al. | 372/50 |
| 4,546,244 | 10/1985 | Miller | 250/211 |
| 4,550,410 | 10/1985 | Chenuasky et al. | 372/97 |
| 4,558,449 | 12/1985 | Gordon | 372/44 |
| 4,573,156 | 2/1986 | Anthony et al. | 372/19 |
| 4,575,851 | 3/1986 | Seki et al. | 372/45 |
| 4,583,226 | 4/1986 | Liou | 372/19 |
| 4,583,820 | 4/1986 | Flamand et al. | 350/96.19 |
| 4,585,491 | 4/1986 | Burnham et al. | 148/1.5 |
| 4,589,115 | 5/1986 | Burnham et al. | 372/92 |
| 4,599,728 | 7/1986 | Alavi et al. | 372/45 |
| 4,602,370 | 7/1986 | Tsang | 372/45 |
| 4,603,420 | 7/1986 | Nishizawa et al. | 372/45 |
| 4,618,959 | 10/1986 | Mito | 372/46 |
| 4,622,674 | 11/1986 | Mito | 372/45 |
| 4,658,402 | 4/1987 | Kobayashi | 372/50 |
| 4,660,206 | 4/1987 | Halmos et al. | 372/28 |
| 4,665,527 | 5/1987 | Akiba et al. | 372/96 |
| 4,671,830 | 6/1987 | Burnham | 148/186 |
| 4,674,094 | 6/1987 | Murakami | 372/45 |
| 4,680,768 | 7/1987 | Yagi | 372/45 |
| 4,705,361 | 11/1987 | Frazier et al. | 350/355 |
| 4,709,371 | 11/1987 | West | 372/44 |
| 4,718,070 | 1/1988 | Liau et al. | 372/50 |
| 4,796,269 | 1/1989 | De Freez et al. | 372/50 |
| 4,869,780 | 9/1989 | Yang et al. | 372/50 |
| 4,881,236 | 11/1989 | Brueck et al. | 372/45 |
| 4,881,237 | 11/1989 | Donnelly | 372/45 |
| 4,899,361 | 2/1990 | Numai | 372/50 |
| 4,901,327 | 2/1990 | Bradley | 372/45 |

OTHER PUBLICATIONS

Bachtold et al., "Integrated Bidirectional Fiber Optic Repeater", 4/81, IBM Tech. Dis. Bull., vol. 23, #11.
Lozes-Duony et al., "Recent Developments . . . Diode Lasers", J. Opt. (France), vol. 20, #2, pp. 65–70, 3-4/89.

Primary Examiner—Nelson Moskowitz
Attorney, Agent, or Firm—Brown, Martin, Haller & McClain

[57] ABSTRACT

At least one optical resonator having a selected optical processing property is formed upon a substrate. Various property resonators may be stacked upon one another so as to share a common optical axis. A resonator typically has a pair of multilayer dielectric or semiconductor mirrors formed on opposite ends of an optical cavity with the mirrors formed in a plane parallel to the substrate surface. Temperature and mechanical stability superior to current technology is thus achievable in the structure. Additional combinations of mirrors, cavities and gratings may be formed in conjunction with the resonator.

18 Claims, 4 Drawing Sheets

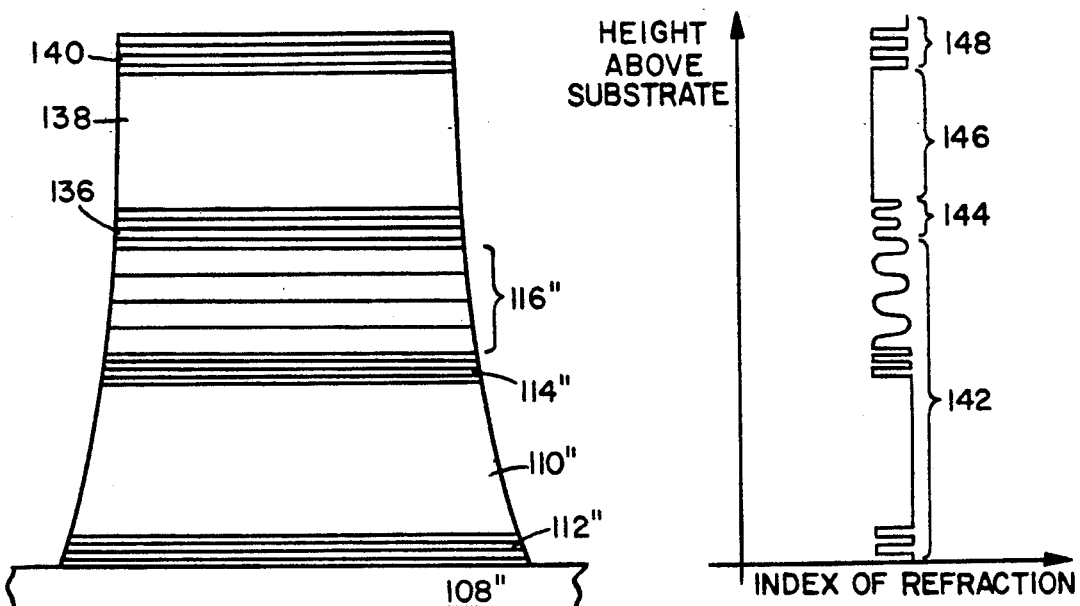
FIG. 12
FIG. 13
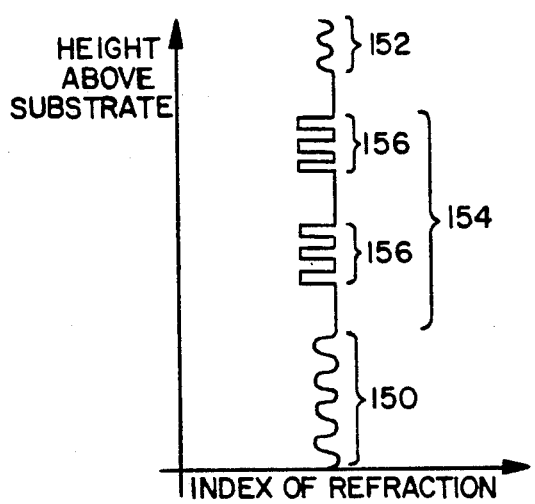
FIG. 14
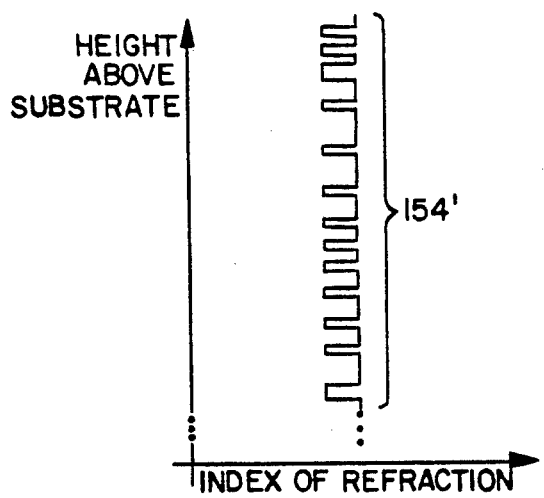
FIG. 15
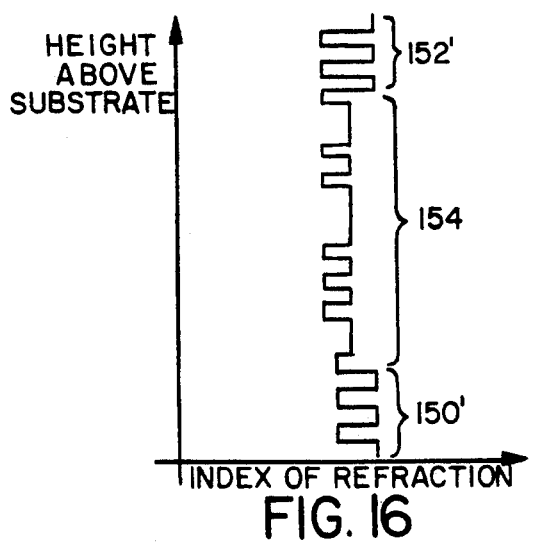
FIG. 16
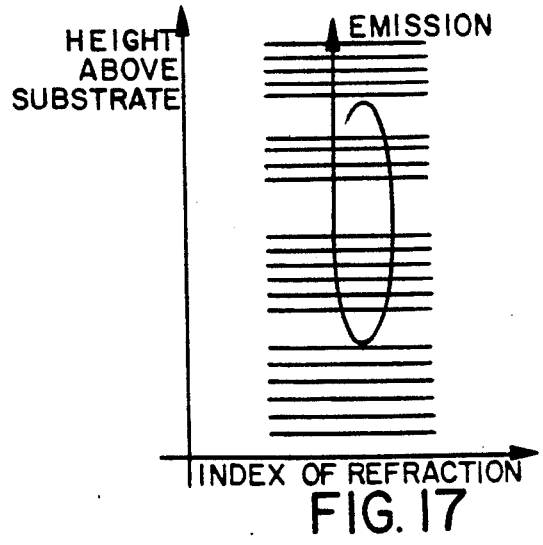
FIG. 17

OPTICAL RESONATOR STRUCTURES

BACKGROUND OF THE INVENTION

I. Technical Field

The present invention relates to optical electronics. More specifically, the present invention relates to integrated optical electronics for use in optical communication and computing applications, wherein the integrated optical electronics are primarily fabricated in the form of monolithic semiconductor structures.

II. Background Art

Conventional integrated optics apparatus for communications or computation typically comprise active devices such as emitters, modulators, and detectors as well as passive devices such as resonators for filtering. These devices may range in size from relatively large glass reflectors and mirrors to microscopic semiconductor laser diodes. In any case, each device is generally a separate, discrete component. Therefore, assembling a complete optical communications or computation system comprising a combination of such devices requires physical integration at the component level of many different optical devices. Many disadvantages arise as a result of such component-level integration.

Most obvious is the difficulty encountered in assembling components to provide the extremely accurate alignments necessary for proper operation. The resulting misalignments greatly complicate coupling the plurality of devices to a single optical beam.

A further disadvantage of the prior art component-level architecture is its susceptibility to disalignment due to vibration and temperature fluctuation. Because the optical devices are merely interconnected and do not share a sufficiently substantial common structural support, they are likely to become disaligned or detuned from mechanical vibration or thermal expansion or contraction. Also, the materials of which resonant devices themselves are constituted expand and contract with temperature variations and also show variations in their indices of refraction. These properties cause detuning of resonators and result in wavelength variations in emitted and detected light.

To overcome the disadvantages of the prior art, it is therefore desirable to have a method and apparatus which provides for the integration of optical electronics in primarily monolithic dielectric and/or semiconductor architecture during the fabrication process.

It is further desirable to provide monolithic integrated optics whereby each optical device is very closely aligned to a common optical axis so as to facilitate the coupling of all devices to a single optical beam or single mode optical fiber.

The novel method and apparatus of the present invention provides integrated optics which overcome the disadvantages of the prior art and further provide many significant new features and advantages.

SUMMARY OF THE INVENTION

The present invention provides a novel and improved method and apparatus of integrated optics which overcome the disadvantages of the prior art, and further provides significant new advantages.

In preferred embodiments, the present invention comprises a plurality of optical resonators which may be active resonators such as emitters or detectors and/or passive resonators such as resonators for filtering, for example. The resonators are successively formed primarily by epitaxial growth for semiconductors or sputtering for dielectrics, stacked immediately adjacent to one another, typically vertically on top of one another, all originating from a semiconductor substrate. Such a stack of resonators can be fabricated simply and precisely with methods already known in the art such as Vapor Phase Epitaxy (VPE) or Molecular Beam Epitaxy (MBE) combined with well known deposition, etching, and photolithographic techniques.

It is a notable novel feature of the present invention that all resonators are closely aligned to a common optical axis without implementing any alignment procedures.

Due to novel and improved structure, devices in accordance with the present invention provide many advantages. The stacked resonators can be fabricated consistently with conventional techniques such as VPE and MBE and Ion Beam Sputtering, and they require no assembly or alignment past the fabrication stage. Further, because of the stacked architecture, they are wafer space efficient and can be coupled to a single optical beam or single mode optical fiber by Holographic Optical Elements (HOE's) being developed elsewhere. Therefore, many resonator stacks may be easily integrated into a two dimensional array of stacks for use in appropriate systems. Additionally, because all of the resonators are monolithic, they will remain tuned under significant mechanical vibration and temperature variation.

Temperature stability is particularly enhanced when dielectric materials which have specially temperature stabilized refractive indices are employed. This feature can be accomplished by choosing the materials according to their coefficients of thermal expansion and the variation of refractive index with temperature. By proper selection and processing of materials, one can fabricate structures with alternating layers having thermal variations which cancel each other, or one can fabricate mixtures of such materials (composite layers) which have thermal variations which are greatly reduced. The active material can be a nonlinear glass which can achieve optic-optic modulation since this material might be easier than single crystal semiconductor materials to fabricate between two multilayer dielectric mirrors. Dielectric materials are suggested since this material type shows the greatest promise for temperature stabilized properties.

Various configurations of active and/or passive resonator stacks may be produced in accordance with the present invention merely by varying the composition and doping profiles while growing the devices, and/or further altering the semiconductor properties with techniques such as diffusion or ion implantation. In addition, sputtering and evaporation deposition techniques may be employed in situ, creating layers comprised of materials substantially different from the semiconductor material.

BRIEF DESCRIPTION OF THE DRAWINGS

These and other features and advantages of the invention will become fully apparent from the detailed description set forth below when taken in conjunction with the drawings wherein:

FIG. 12 illustrates in schematical form a surface-emitting laser similar to that of FIG. 9 having formed on top thereof an electronically adjustable cavity used for coupling light from the surface emitting laser;

FIG. 13 is a graph corresponding to FIG. 12 illustrating the index of refraction with respect to height above the substrate for the laser of FIG. 11;

FIG. 14 is a graph illustrating for a surface-emitting laser the index of refraction versus height above substrate;

FIG. 15 is a graph illustrating a variation in the index of refraction profile for the active region of FIG. 14;

FIG. 16 is a graph illustrating the index of refraction versus height above substrate for a variation of a surface emitting laser;

FIG. 17 is the emission in a structure constructed according to the index of refraction of FIG. 16;

DETAILED DESCRIPTION OF THE PREFERRED EMBODIMENTS

Figure 1:
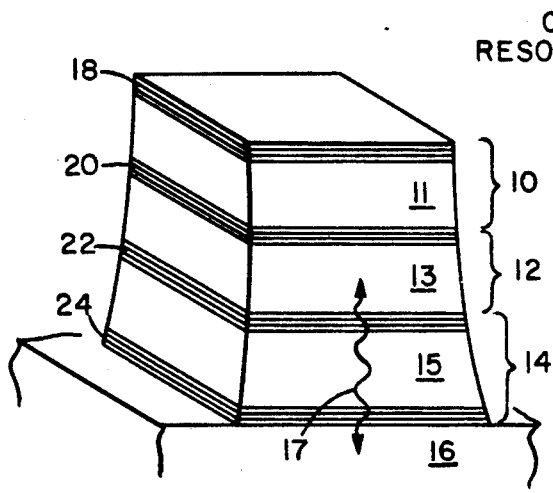
FIG. 1 illustrates in the schematical form a cross section of an exemplary resonator structure formed upon a substrate.

FIG. 1 illustrates a first preferred embodiment of the present invention in which at least one surface emitting (SE) laser is coupled to at least one cavity or resonator structure for optical devices.

This first embodiment comprises Fabry-Perot resonators 10, 12 and 14 which represent a plurality of resonators stacked immediately adjacent to one another. This embodiment further comprises substrate 16 which may be formed of a conductive or semi-insulating material upon which the stack of resonators is formed. The structure is typically fabricated by epitaxial growth of III-V semiconductor materials, such as the $Al_xGa_{1-x}As$ family for example, upon a substrate. The layers comprising the resonators are each subsequently formed by monolithic fabrication techniques known in the art such as epitaxial growth or sputtering combined with photolithographic, deposition and etching techniques.

Resonators 10, 12, and 14 include corresponding optical cavities 11, 13, and 15 respectively. The optical cavities may be passive, for filtering for example. In the alternative the optical cavities may be active, containing doping profiles providing saturable absorbers, electro-absorption media, optically bi-stable material, or lasing or light emitting junctions, for example.

Resonators 10, 12, and 14 further comprise multilayer dielectric mirror structures represented by dielectric mirrors 18, 20, 22 and 24. Each resonator has an associated pair of multilayer mirrors, i.e. mirrors 18 and 20 being associated with resonator 10, mirrors 20 and 22 with resonator 12, and mirrors 22 and 24 with resonator 14. The dielectric mirrors are fabricated of a plurality of alternating layers of high and low refractive index dielectric or semiconductor material. The semiconductor mirrors are lattice matched to the semiconductor material of the optical cavity between the mirrors so that high-quality crystal growth can be achieved throughout the structure. The number, dimensions and composition of the dielectric or semiconductor layers comprising the dielectric or semiconductor mirrors and optical cavities may be varied as prescribed by optical wave theory, well understood in the art, so as to provide desired wavelength selectivity and reflectance/transmittance variation. In the first preferred embodiment the resonators are typically tuned near the same wavelength to provide enhanced propagation and coupling at that wavelength.

In the first preferred embodiment, at least one of optical cavities 11, 13 or 15 comprises a semiconductor doping profile such that an active region is formed within the optical cavity. The active region, in cavity 15 for example, is capable of being pumped by electron/hole injection so that resonator 14 forms a surface-emitting laser or a light-emitting diode (LED). The direction of light emission, as indicated by arrow 17, is perpendicular to a plane common to mirrors 22, 24 and cavity 15. The remaining resonator/cavity layers of the device may be passive, acting as filters for example, or active, containing doping profiles providing saturable absorbers, electro-absorption media, or optically bi-stable materials, for example.

The first preferred embodiment of the present invention allows surface-emitting lasers, such as the SE laser of resonator 14, which comprise at least one of its resonators, to be coupled to cavities, such as cavities 11 and 13, containing other active or passive materials. Examples of highly-useful implementations of such cavity coupling are cavities having saturable absorbers for mode locking, electro-absorption media for modulation, or optically bi-stable materials for logic functions. It is understood that any number, combination, and ordering of such resonators can be constructed in accordance with the generic principles of the present invention.

Furthermore, according to the first preferred embodiment of the present invention, resonators 10, 12 and 14 have their resonant frequencies very near each other so that the light emitted by one resonator is efficiently coupled to other resonators. Efficient coupling is accomplished by fabricating each resonator's associated mirrors, as prescribed by thin film optical theory understood in the art, so as to provide each resonator with a bandpass filter characteristic.

Figure 2:
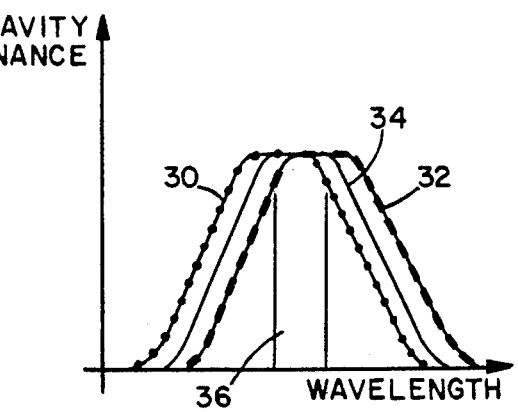
FIG. 2 is a graph of cavity resonance with respect to wavelength relative to the exemplary structure as disclosed with reference to FIG. 1.

An exemplary plot of cavity resonance is shown in FIG. 2. Curve 30 shows the cavity resonance characteristics of resonator 10, curve 32 shows the characteristics of resonator 12, and curve 34 shows the characteristics of resonator 14. Given such a resonator configuration, the present invention allows wavelengths in a highly reflected range, area 36, to be coupled and propagate throughout the device while other undesirable frequencies are rejected. This feature provides for exceptional longitudinal mode discrimination.

The first preferred embodiment further provides for exceptional mode discrimination because surface emitting lasers are employed rather than the more conventional edge emitter. Surface emitting lasers have a cavity length typically two orders of magnitudes shorter than conventional edge emitters. In the conventional edge emitter diode laser, the longitudinal modes are typically a few angstroms apart. However, because the surface emitting laser has a cavity length much shorter than the edge emitter, the longitudinal modes are separated by as much as several hundred angstroms. Under these circumstances, the passband of a series of mirrors similar to those with characteristics corresponding to FIG. 2 provides useful mode discrimination.

The present invention as implemented as disclosed with reference to FIG. 1 further provides for accurate control of coupling strength between resonating cavities over a wide range. This aspect of the invention is due to the fact that the dielectric mirror or semiconductor reflectivity can be accurately controlled by altering the number and thicknesses of various layers in the mirrors which separate the resonators.

It is further possible to avoid the need for coupled cavities in particular instances by growing, for example, a layer of saturable absorber material (for mode locking) in the same resonator as the active layer of the laser. This can be viewed as the limiting case of strongly coupled cavities, in which the reflectivity of the mirror separating the two cavities goes to zero.

Figure 3:
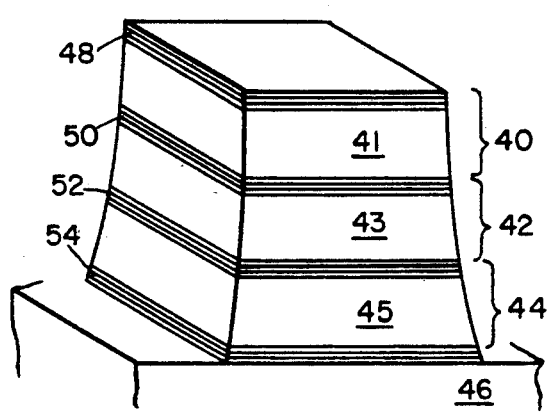
FIG. 3 illustrates a structure similar to FIG. 1 configured for wavelength multiplexing/demultiplexing and emission/detection.

A second preferred embodiment is shown in FIG. 3. The second embodiment is similar in structure to the first preferred embodiment, however, the second embodiment is designed and suited for wavelength multiplexing/demultiplexing and emission/detection. To provide these functions, each successive resonator in the second embodiment is tuned to a resonator at a longer wavelength which is still in the passband of the preceding resonator. This differs from the first embodiment in which certain resonators are tuned slightly off a common wavelength to provide coupling between signals emitted by the emitter or emittees of the other cavities.

As illustrated in FIG. 3, the second embodiment, like the first embodiment, comprises vertically stacked Fabry-Perot resonators 40, 42, and 44 which represent a plurality of resonators stacked immediately adjacent to one another, as well as conductive or semi-insulating substrate 46. This device is also fabricated primarily by epitaxial growth of III-V semiconductor materials, such as the $Al_xGa_{1-x}As$ family for example, in combination with deposition, etching, and photolithographic techniques.

Resonators 40, 42 and 44 include corresponding optical cavities 41, 43, and 45, respectively. The cavity layers may be passive for filtering, or active, containing doping profiles providing saturable absorbers, electro-absorption media, optically bi-stable material, or lasing or light-emitting junctions, for example.

Resonators 40, 42, and 44 further comprise multilayer dielectric mirror structures represented by multilayer dielectric mirrors 48, 50, 52 and 54. Each resonator has an associated pair of multilayer mirrors; mirrors 48 and 50 being associated with resonator 40, mirrors 50 and 52 with resonator 42, and mirrors 52 and 54 with resonator 44. As in the first embodiment, the semiconductor mirrors are fabricated of a plurality of alternating layers of high and low index semiconductor material. These layers are lattice matched to the semiconductor material in between the mirrors so that high-quality crystal growth can be achieved throughout the structure. The number, dimensions and composition of the semiconductor layers comprising the mirrors and cavities may vary as prescribed by optical wave theory, understood in the art, so as to provide wavelength selectivity and reflectance/transmittance variation.

The second preferred embodiment allows separate generation and detection of separate optical signals which have been impressed on optical beams of separate wavelength in the case where all those signals are traveling in the same beam, for example on the same optical fiber.

Resonators 40, 42, and 44 have their resonant frequencies separated from one another so that the light emitted or detected by one resonator is transparent to another resonator. This aspect is accomplished by fabricating each resonator's associated mirrors so as to provide each resonator with a low-pass filter characteristic. The low-pass filter characteristics results in high optical frequencies (shorter wavelengths) being resonated, and low optical frequencies (longer wavelengths) being transmitted. An example of such a resonator transmittance configuration is shown in FIG. 4.

Figure 4:
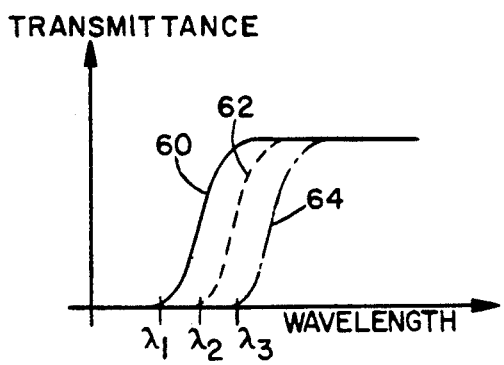
FIG. 4 is a graph illustrating transmittance versus wavelength characteristics of the resonators of FIG. 3.

Referring to FIGS. 3 and 4, mirrors 48 and 50 of resonator 40 have dimension and composition configuration such that their interaction provides resonator 40 with a cut off wavelength $\lambda_1$, illustrated by curve 60. Furthermore, the active material of optical cavity 41 is formed of a high bandgap material such that it absorbs the shorter wavelength signals and is thus sensitive to a wavelength less than the cutoff wavelength $\lambda_1$. Resonator 42 of FIG. 3 comprises mirrors 50 and 52 and optical cavity 43 with the active material in optical cavity 43 having a lower bandgap than optical cavity 41. Resonator 42 has a cut off wavelength $\lambda_2$ illustrated by curve 62 and or is responsive to wavelengths between the cutoff wavelengths $\lambda_1$, typically nearer, the cutoff wavelength $\lambda_2$. Similarly, resonator 44 comprises mirrors 52 and 54 and optical cavity 45 with the active material in optical cavity 45 having a lower bandgap than optical cavity 43. Resonator 44 has a cut off wavelength $\lambda_3$, illustrated by curve 64 and is responsive to wavelengths between cutoff wavelengths $\lambda_2$ and $\lambda_3$, typically nearer the cutoff wavelength $\lambda_3$. Such a scheme may be continued down a stack having a greater number of resonators than illustrated in FIG. 3.

Any combination and number of resonators having wavelength selectivity as described may be constructed in accordance with the present invention. If the active layers of the resonators are all detectors, as in, for example, a structure used to demultiplex the output of an optical fiber carrying a wavelength multiplexed signal, then each of the optical cavities can be made of a ternary alloy such as $Al_xGa_{1-x}As$ where the composition is changed in each detector layer so that the higher band gap materials are on the top of the stack and tend to be transparent to the longer wavelengths in the multiplexed signal. The optical cavities can be made relatively thin because the resonator causes the beam having the desired wavelength to make multiple passes through the detector medium, thus increasing the interaction length. The thin layers also provide reduced residual absorption of the longer wavelengths in the higher band gap layers on top so as to reduce crosstalk in the detector/receiver.

Additionally, a stack of surface-emitting lasers may be fabricated in accordance with the second embodiment of the present invention. Such a configuration could be realized with the SE laser on top having the shortest wavelength of emission and the laser on the bottom having the longest wavelength of emission.

Also, combination modules having one or more resonators containing detector material and one or more resonators having a lasing medium may be fabricated. In such a configuration the detector layer or layers could operate as horizontal p-i-n structures with p and n regions only on the edges of the layer. This would require good intrinsic material for the growth layer. One might observe that such a structure is similar to a photoconductive detector. Alternatively, the detector layer or layers may be grown intrinsic having ohmic contacts provided at the layer's edges. Thus configured, the layer may operate as a photoconductive device instead of a p-i-n detector.

The doping for the SE lasers in a combination module typically requires a p-n junction, and high-band gap layers surrounding the active region for injected current confinement. Such a doping profile may be achieved by doping n type during growth and opening a small diffusion window, with photolithographic and etching techniques known in the art so that a p-type doping may be introduced.

A specific implementation of the second preferred embodiment is particularly suited to be a frequency modulation (FM) to amplitude modulation (AM) converting detector for coherent optical communications. In such an implementation, cavities 41, 43 and 45 of FIG. 3 each comprise active detector material, each having a different bandgap. Resonator 40 passes wavelengths greater than the cutoff wavelength $\lambda_1 x$ illustrated by curve 60, and has detector material having a bandgap responsive to wavelength less than the cutoff wavelength of curve 60. Resonator 42 passes wavelengths greater than the cutoff wavelength $\lambda_2$ illustrated by curve 62 and has bandgap material responsive to wavelengths between the cutoff wavelengths $\lambda_1$ and $\lambda_2$, typically nearer cutoff wavelength $\lambda_2$. Resonator 44 passes wavelengths greater than the cutoff wavelength $\lambda_2$ and has a bandgap detector material responsive to wavelengths between the cutoff wavelengths $\lambda_2$ at curve 62 and $\lambda_3$ at curve, 64, typically nearer the cutoff wavelength $\lambda_3$. Thus, each successive resonator is responsive to longer wavelengths than the previous resonator and shorter wavelengths than the following resonator. Therefore, each resonator is capable of converting a selected frequency band from the incoming optical beam to an electrical amplitude. Such a configuration simplifies the required structure and increases the performance in the detection of coherent FM optical signals for fiber optic data links or other optical data processing systems.

Figure 5:
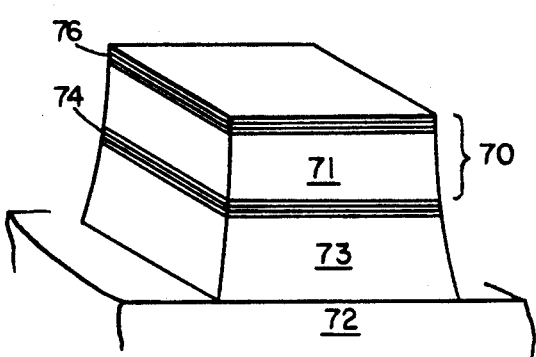
FIG. 5 illustrates a single resonator FM to AM converter structure.

Slight variation of the second preferred embodiment further provides stacks of optical devices suitable for FM to AM converting. One such configuration is shown in FIG. 5. This configuration comprises a single Fabry-Perot resonator 70. Resonator 70 comprises optical cavity 71 and multilayer dielectric mirrors 74 and 76. Optical cavity 71 is formed primarily of semiconductor material having a doping profile providing photodetection properties. The material of cavity 71 is responsive optimally to wavelengths near the center of wavelength of curve 80 of FIG. 6. Resonator 70 may be formed upon a substrate 72 or a layer 73 between substrate 72 and resonator 70.

Figure 6:
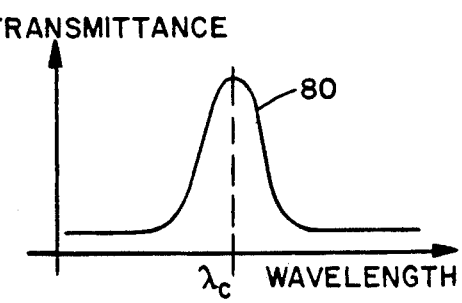
FIG. 6 is a graph illustrating the characteristics of the FM to AM converter of FIG. 5.

Cavity 71 together with mirrors 74 and 76 are configured to provide a resonator having wavelength response as illustrated in FIG. 6. So configured, out-of-band frequencies carried by a received optical beam are reflected by resonator 70. Frequencies in band, near the center wavelength $\lambda_c$ of curve 80, enter the resonator and are absorbed by the detector medium of cavity 71. Thus, the configuration illustrated in FIG. 5 is capable of converting frequencies in the wavelength range near the center wavelength to an electrical amplitude, while rejecting all other frequencies. Such a "single resonator FM to AM converter" can be incorporated with other structure to provide a device in accordance with the present invention.

Figure 7:
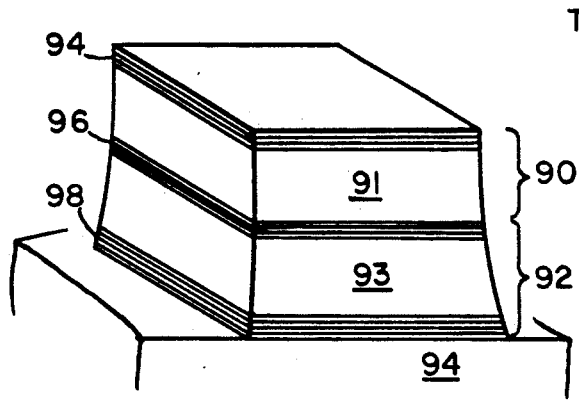
FIG. 7 illustrates an alternate embodiment to an FM to AM converter.
Figure 8:
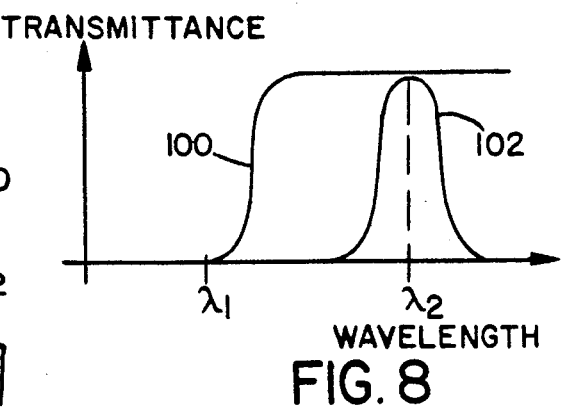
FIG. 8 is a graph illustrating the response characteristics of the structure of FIG. 7.

An additional variation of the second preferred embodiment suitable for FM to AM converting is shown in FIG. 7. This variation comprises resonator 90 formed upon resonator 92 which is formed upon substrate 94. Resonator 92 comprises optical cavity 93 and broadband multilayer semiconductor mirrors 96 and 98. Cavity 93 is formed primarily of a semiconductor material having a doping profile which provides photodetection properties. The material of cavity 93 is responsive optimally to wavelengths near wavelength $\lambda_2$ FIG. 8. Cavity 93, together with mirrors 96 and 98, are configured to provide a Fabry-Perot resonator having wavelength response according to curve 102 as illustrated in FIG. 8.

Resonator 90 of the FM to AM converter of FIG. 7 further comprises multilayer dielectric mirrors 94 and 96, and optical cavity 91. Cavity 91, together with mirrors 94 and 96 are configured to provide resonator 90 with a mirror 94 having a wavelength response according to curve 100 as shown in FIG. 8. Mirror 94 may thus be considered as a longwave pass filter. Cavity 91 is formed primarily of semiconductor material having a doping profile which provides photodetection properties and is a higher bandgap material than cavity 93. The material of cavity 91 is responsive optimally to wavelengths lower than wavelength $\lambda_1$, but near wavelength $\lambda_1$.

An optical signal, input to the device of mirror 94, having a wavelength of $\lambda_1$ sees high reflectivity at mirrors 94 and 96 so it appears as a resonator, but only to $\lambda_1$ wavelength signals. The detector material of optical cavity 91 absorbs the energy at $\lambda_1$ but not at $\lambda_2$. Signals at $\lambda_2$ wavelength pass through mirror 94 and cavity 91 where it sees mirrors 96 and 98 as forming a resonator.

This variation of the second preferred embodiment as illustrated in FIG. 7 converts frequencies having a wavelength less than wavelength $\lambda_1$ but, near wavelength $\lambda_1$, to a first amplitude corresponding electrical signal, while converting frequencies having a wavelength near $\lambda_2$ to a second amplitude corresponding electrical signal. Thus, differential detection may be accomplished between two different frequency bands of a received optical signal which is shifted between the wavelength region less than wavelength $\lambda_1$ and the wavelength region near wavelength $\lambda_2$. It is notable that this system does not require a local oscillator. It is understood that the number of resonators and specific wavelength responses of the resonators may be varied according to the present invention while still providing FM to AM converting.

Figure 9:
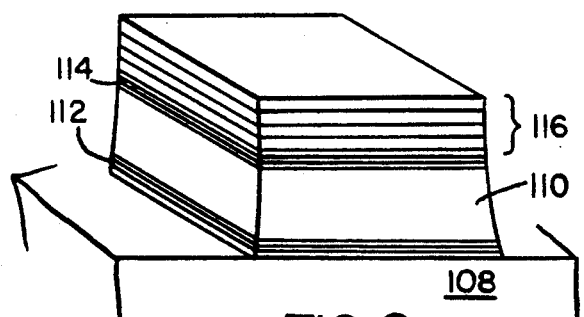
FIG. 9 illustrates in schematical form a surface emitting laser formed upon a substrate and having a feedback grating formed upon the laser.

A third preferred embodiment of the present invention is shown in FIG. 9. FIG. 9 illustrates an external grating feedback surface-emitting laser in accordance with the present invention. This device comprises substrate 108, laser active region 110, multilayer dielectric mirrors 112 and 114, and feedback grating region 116. Mirror 112 is formed on substrate 108, with laser active region 110 disposed between mirrors 112 and 114, and feedback grating region 116 formed on mirror 114.

Substrate 108 is typically a III-V material which may be conductive or semi-insulating. Semiconductor mirrors 112 and 114 are fabricated of a plurality of alternating layers of high and low index semiconductive material. These layers are lattice matched to the semiconductor material in between the mirrors, so that high-quality crystal growth can be achieved throughout the structure. The number, dimensions, and composition of the semiconductor layers comprising the mirror and laser cavity may vary so as to provide frequency selectivity and reflectance/transmittance variation. Laser active region 110 further comprises a semiconductor doping profile such that an active region is formed in the optical cavity. Laser active region 110 is capable of being pumped by electron/hole injection so that the cavity forms a surface-emitting laser. Feedback grating region 116 may be formed by methods such as epitaxial crystal growth, sputtering, electron beam evaporation, or thermal evaporation techniques, for example. Feedback grating region 116 comprises a material which has a periodic variation in its refractive index.

Figure 10:
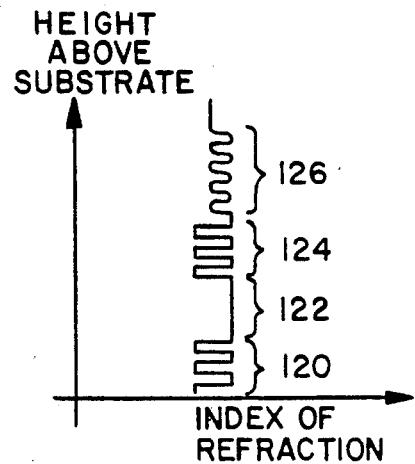
FIG. 10 is a graph illustrating the relative index of refraction versus height above the substrate for the laser of FIG. 9.

The index of refraction profile as a function of height above the substrate of the device of FIG. 9 is shown in FIG. 10. Region 120 is an exemplary refractive index profile of multilayer dielectric or semiconductor mirror 112. Region 122 is an exemplary profile of the index of refraction of the laser active region 110. Region 124 is an exemplary profile of multilayer dielectric or semiconductor mirror 114. Region 126 is an exemplary profile of the refractive index of feedback grating region 116.

The device of the third preferred embodiment of the present invention uses optical resonators containing index variations, feedback grating region 116 of FIG. 9, to feedback selected spectral components into the laser resonator. The effect of this is to encourage lasing action at the wavelength which has been fed back. Such a configuration of the present invention serves to control the wavelength of emission of a surface emitting laser. The external grating, feedback grating region 116, can be passive thus stabilizing the wavelength, or it can be active to allow wavelength tunability.

The surface-emitting laser of the third embodiment is contained between the lower two multilayer dielectric or semiconductor mirrors 112 and 114. Above the laser is grown or deposited a material which has a periodic variation in its refractive index to form a grating. This grating reflects light at the Bragg wavelength, which is near the wavelength that is twice the peak-to-peak spacing of the periodic index variation. The reflected light is fed back into the laser resonator so as to lock the wavelength of emission to the Bragg wavelength.

If the grating is fabricated by a process such as MBE, it is very easy to shorten the period of the index variation to less than 1,000 angstroms, thus allowing feedback gratings for visible wavelength lasers to be easily fabricated.

If the grating is constructed of semiconductor materials (e.g., GaAs/AlGaAs) the index of refraction can be modified by injection of current into the grating material at electrodes formed upon the grating. Current injection will change the Bragg wavelength of the grating. Since the laser's wavelength is locked to the Bragg wavelength of the grating. The wavelength of the laser's emission will change accordingly. As a result a tunable wavelength laser is created. The very wide spacing and wavelength of the longitudinal modes of the surface-emitting laser will allow a wider range of continuous tunability than has been possible with conventional edge-emitting structures.

Figure 11:
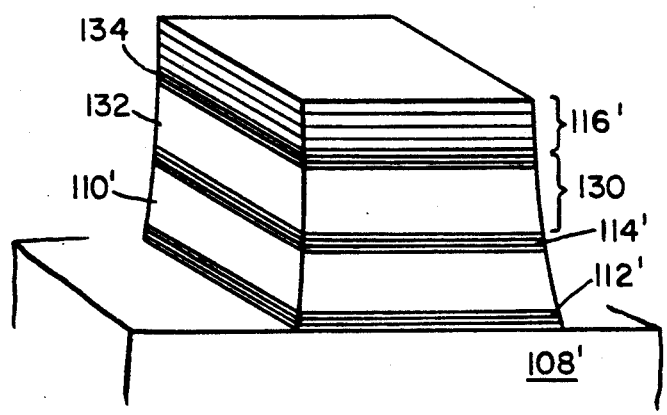
FIG. 11 is an alternate embodiment of the structure of the surface emitting laser of FIG. 9 incorporating a phase control resonator.

As in conventional active feedback diode laser structures, it may be necessary to insert a third resonator with electrically-controlled index to provide phase control. Such a variation of the third preferred embodiment of the present invention is illustrated in FIG. 11. FIG. 11 shows phase control resonator 130 disposed between feedback grating region 116' and the surface-emitting laser, the laser comprising laser-active region 110' and multilayer dielectric or semiconductor mirrors 112' and 114'. Phase control resonator 130 comprises a cavity of semiconductor material 132 and multilayer dielectric or semiconductor mirror 134. Phase control resonator 130 utilizes mirror 114 with cavity 132 disposed between mirrors 114 and 132.

A variation of the third preferred embodiment of the present invention provides electronically adjustable cavity coupling for surface-emitting lasers and is illustrated in FIG. 12. This feature is accomplished by coupling the external grating feedback surface-emitting laser to an adjacent cavity, comprising multilayer dielectric or semiconductor coupling mirror 136, cavity 138 and mirror 140.

The index of refraction profile of such a configuration is shown in FIG. 13. Region 142 is identical to the profile of the external grating feedback surface-emitting laser as shown in FIG. 10. Regions 144, 146, and 148 comprise the adjacent resonator to be coupled to the surface-emitting laser. Region 144 is a tunable coupling grating or mirror 136 having a periodic index of refraction that is identical to the periodic index variation of the grating 114" of the external grating feedback surface-emitting laser of FIG. 12. Region 146 is either active or passive semiconductor material corresponding to cavity 138. Region 148 is a multilayer dielectric or semiconductor mirror corresponding to mirror 140.

The coherent light emitted from the surface-emitting laser is coupled to the resonator comprising regions 144, 146, and 148 by tunable coupling grating 136. The coupling grating's reflectivity at the laser's emission wavelength can be controlled by injecting current into the coupling grating at electrodes coupled thereto. Thus, coupling grating 136 can be tuned or detuned so as to reflect or transmit the light generated by the surface-emitting laser. If coupling grating 136 strongly reflects the light at the laser's emission wavelength, the laser will be minimally coupled to the second cavity. If the tunable coupling grating 136 transmits light at the laser's emission wavelength, the laser will be strongly coupled to the second cavity.

Like other preferred embodiments of the present invention, the number, composition, order, and combination of resonators and related structures may vary in accordance with the third preferred embodiment.

Utilizing the basic teaching presented above many variations in formation of the cavities, mirrors and gratings may be generated. Each of these structures may be represented easily by a graph illustrating index of refraction versus height above the substrate. For purposes of convenience, the formation of these various layers is presented in the form of these charts.

Many embodiments of the present invention may incorporate surface-emitting lasers having their emission wavelength stabilized by variably spaced quantum wells. The index of refraction profile of one such wavelength stabilized surface-emitting laser is shown in FIG. 14. Regions 150 and 152 have periodically varying index such that they have optimum reflectance at a single frequency which has wavelength twice the distance of the periodic variation. Mirrors 150 and 152 serve as the reflecting mirrors for the resonating cavity 154 of active material which includes quantum well layer regions 156.

Quantum wells are formed in the active layer by "shuttering" or selectively introducing an aluminum component, along with the Ga and As components during the epitaxy technique formation of the active layer. The introduction of quantum wells into the optical cavity active layer 154 will lower the lasing threshold current due to the reduced density of states in the well. Quantum wells formed in the optical cavity active layer also increase the wavelength of emission due to the reduced bandgap in the active layer. Increased emission wavelength allows the lowest bandgap in the multilayer semiconductor mirrors to be lowered. A reduction in the lowest bandgap in the multilayer semiconductor mirrors will permit the index of refraction to increase and thus improve reflectivity of the mirrors.

FIG. 14 shows evenly "chirped" spacing of quantum wells. Alternatively, the active cavity region 154 including quantum well layer regions 156 may be replaced by quantum wells varying sinusoidally such as illustrated in FIG. 15. Furthermore, sinusoidally varying index of refraction mirrors 150 and 152 may be alternatively replaced with conventional multilayer mirrors having stepped index of refraction profiles such as multilayer dielectric or semiconductor mirrors 150' and 152' shown in FIG. 16.

As illustrated in FIG. 17, such index of refraction profiles stabilize the emission wavelength of a surface-emitting laser because the gain is significantly greater in the regions with a high density of quantum wells than in the regions without quantum wells. The wavelength experiencing the greatest gain will be equal to twice the spacing of the peak gain regions (i.e., twice the spacing of the groups of quantum wells). Other wavelengths are not as highly favored and therefore will tend not to oscillate.

Figure 18:
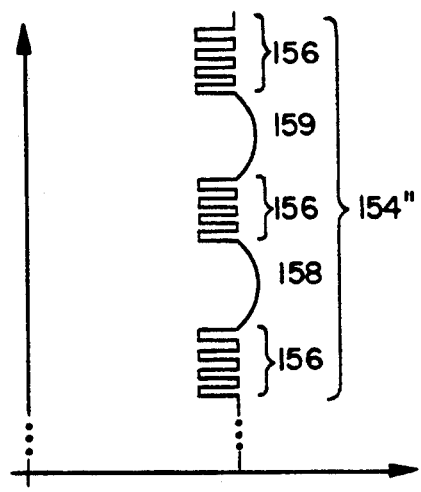
FIGS. 18-19 are variations of the active region as described with reference to FIGS. 14-16.
Figure 19:
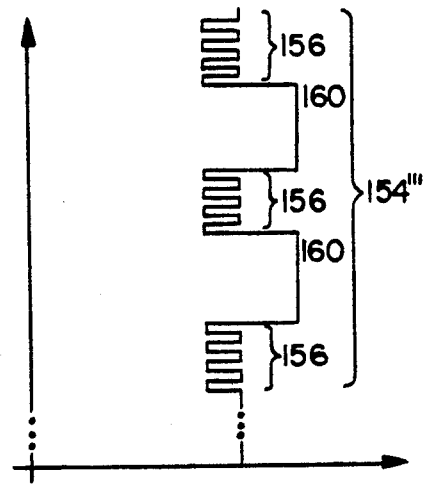

Alternative index of refraction profiles for the active region comprising active layer region 154 of FIG. 14 are shown in FIGS. 18 and 19. FIG. 18 illustrates an active layer region 154" having regions 158 between the quantum wells regions 156 smoothly graded. FIG. 19 illustrates the active layer region 154''' comprising the quantum well regions 156 having regions 160 between the quantum wells stepped in index of refraction. It is understood that many combinations and variations of the index of refraction profiles illustrated will provide a wavelength stabilized surface-emitting laser which may be incorporated in embodiments in accordance with the present invention.

It is an important novel feature of the present invention that optical devices comprising resonators and related structures are stacked vertically on top of one another, all successively grown epitaxially and originating from a semiconductor substrate. Yet another important novel feature of the present invention is that the properties of the optical devices and related structures comprising embodiments in accordance with the present invention have operating characteristics which are established merely by varying doping profiles while growing the devices, and/or further altering semiconducting properties with techniques such as diffusion or ion implantation, for example. Additionally, it is another important novel feature of the present invention that the optical devices comprising embodiments of the present invention are integrated during fabrication as stacked combinations of structures which all are closely aligned to a common optical axis perpendicular to the epitaxial layers comprising the device.

It is understood that variations in number, order, compositions, and operating characteristics of the individual optical devices and related structures stacked to comprise the described preferred embodiments of the present invention may be made freely in accordance with the novel features of the present invention. It is further understood that individual optical devices and structures comprising the described preferred embodiments may be integrated with other optical devices and structures not described herein in accordance with the novel features of the present invention.

It should be noted that the drawings of the preferred embodiments enclosed herein illustrate devices having ideally flat sides. However, owing to conventional chemical etching processes which may be employed in producing devices in accordance with the present invention, the sides of the devices may typically taper from substrate toward the top of the device.

Figure 20:
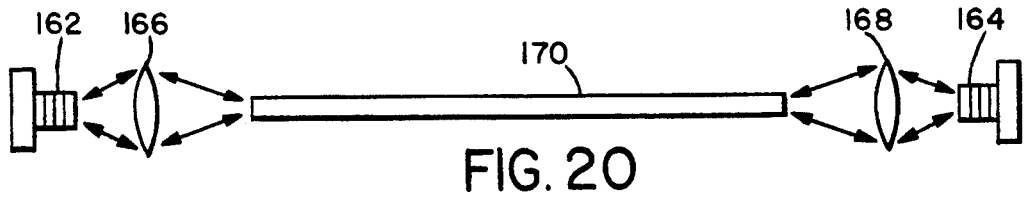
FIG. 20-21 are representative implementations of the integrated optic devices described with reference to FIGS. 1-19.

FIG. 20 illustrates an exemplary implementation of devices in accordance with the present invention. Integrated optical devices 162 and 164 are devices in accordance with the present invention such as those described herein as preferred embodiments. Lenses 166 and 168 are optical lenses capable of focusing light into a narrow optical beam. Optical fiber 170 is a waveguide capable of carrying signals of optical frequency. A system as shown in FIG. 19 could employ devices in accordance with the present invention capable of wavelength multiplexing/demultiplexing and emission/detection for communication of information at optical frequencies.

Figure 21:
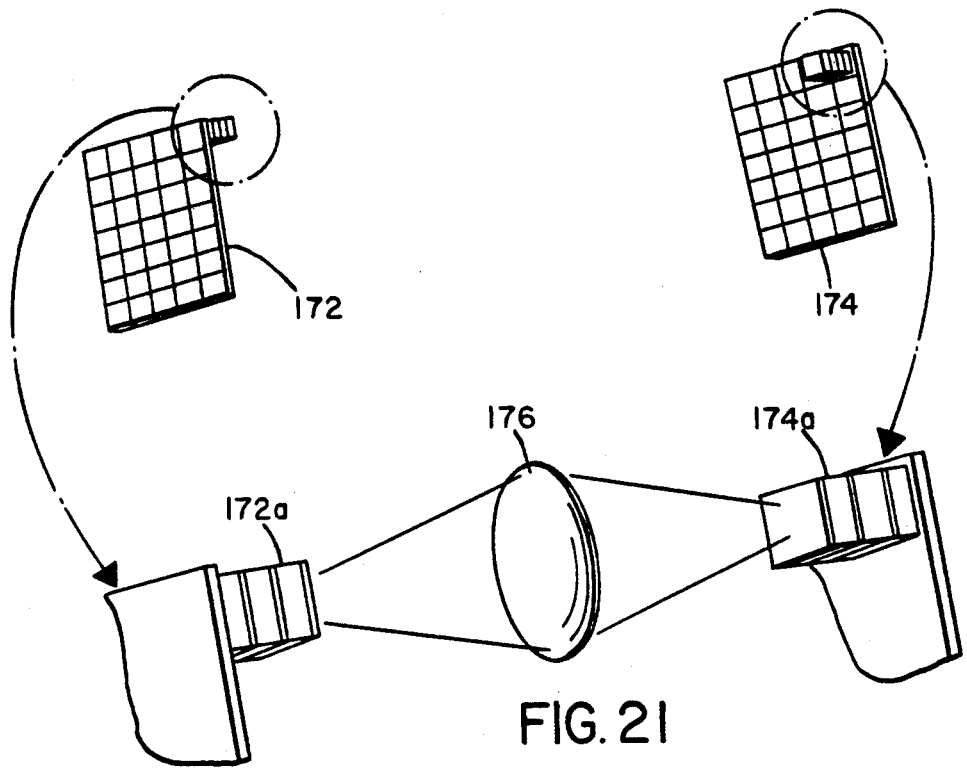

FIG. 21 illustrates devices in accordance with the present invention adapted for use in parallel array processing structures/architectures involving spatial light modulators. Grids 172 and 174 represent a two-dimensional array of integrated optical devices in accordance with the present invention. Integrated optical devices 172a and 174a represent two individual devices, one from each of grids 170 and 172 respectively. Lens 176 represents a lens or other beam-handling equipment.

Integrated optical devices 172a and 174a and lens 178 comprise a single channel of the parallel array processing structure which requires the transmission and reception of multiple wavelengths along one optical beam. Therefore, many embodiments of integrated optical devices in accordance with the present invention could be employed to generate, receive, and process optical signals required for the parallel array processing architecture.

The previous descriptions of the preferred embodiments are provided to enable any person skilled in the art to use the present invention. Various modifications to these embodiments will be readily apparent to those skilled in the art, and the generic principles defined herein may be applied to other embodiments without the use of the inventive facility. Thus, the present invention is not intended to be limited to the embodiments shown herein, but is to be accorded the widest scope consistent with the principles and novel features enclosed herein.

I claim:

1. An integrated optical device for use in communications and computation systems employing signals of optical frequency comprising:

a plurality of optical components fabricated monolithically in a stack upon a substrate, each of said components processing optical signals;

wherein said optical components are stacked parallel and intimately adjacent to one another such that they each are aligned with a common optical axis which is substantially perpendicular to the surface forming the top of said stack;

wherein at least one of said optical components comprises a surface emitting laser for generating said optical signals; and wherein at least one other of said optical components forms a Fabry-Perot resonator optically coupled to said surface emitting laser comprising:

an optical cavity having dimensions to permit resonance of an optical signal at selected optical wavelengths;

a first and second multi-layer mirror disposed on opposite ends of said optical cavity for reflecting selected wavelengths of light within said optical cavity, wherein said first and second multi-layer mirrors form surfaces substantially parallel to one another; and wherein said other optical component cavity is formed primarily of a semiconductor material having an optical response of a saturable absorber, said other optical component for mode locking of a plurality of optical modes generated by said surface emitting laser.

2. An integrated optical device appropriate for use in communications and computation systems employing signals of optical frequency comprising:

a plurality of optical components fabricated monolithically in a stack upon a substrate, each of said components processing optical signals;

wherein said optical components are stacked parallel and intimately adjacent to one another such that they each are closely aligned with a common optical axis which is substantially perpendicular to the surface forming the top of said stack;

wherein at least one of said optical components comprises a surface emitting laser for generating said optical signals; and wherein at least one other of said optical components forms a Fabry-Perot resonator optically coupled to said surface emitting laser comprising;

an optical cavity having dimensions to facilitate the propagation of an optical signal at selected optical wavelengths;

a first and second multi-layer mirror disposed on opposite ends of said optical cavity for reflecting selected wavelengths of light within said optical cavity, wherein said first and second multi-layer mirrors form surfaces substantially parallel to one another; and wherein said other optical component cavity comprises a semiconductor material having an optical response of an electro-absorption media, said other optical component for modulating said optical signal generated by said surface emitting laser.

3. An integrated optical device appropriate for use in communications and computation systems employing signals of optical frequency comprising:

a plurality of optical components fabricated monolithically in a stack upon a substrate, each of said components processing optical signals;

wherein said optical components are stacked parallel and intimately adjacent to one another such that they each are closely aligned with a common optical axis which is substantially perpendicular to the surface forming the top of said stack;

wherein at least one of said optical components comprises a surface emitting laser for generating said optical signals; and wherein at least one other of said optical components forms a Fabry-Perot resonator optically coupled to said surface emitting laser comprising:

an optical cavity having dimensions to facilitate the propagation of an optical signal at selected optical wavelengths;

a first and second multi-layer mirror disposed on opposite ends of said optical cavity for reflecting selected wavelengths of light within said optical cavity, wherein said first and second multi-layer mirrors form surfaces substantially parallel to one another; and wherein said other optical component comprises a semiconductor material being optically bistable.

4. An integrated optical device for use in communications and computation systems employing signals of optical frequency comprising:

a plurality of optical components fabricated monolithically in a stack upon a substrate, each of said components processing optical signals;

wherein said optical components are stacked parallel and intimately adjacent to one another such that they each are aligned with a common optical axis which is substantially perpendicular to the surface forming the top of said stack; and wherein said optical components comprise first and second optical resonators coupled together in back-to-back relationship, each of said resonators comprising:

an optical cavity having dimensions to permit resonance of an optical signal at a plurality of selected optical wavelengths;

first and second mirrors covering opposite sides of said optical cavity for reflecting selected wavelengths of light within said optical cavity, wherein said first and second mirrors form surfaces substantially parallel to one another; and wherein said first and second resonators are configured to resonate at different optical frequencies and wherein said first or second resonator is transparent to the optical signal frequency of the other said second or first resonator.

5. The integrated optical device of claim 4 wherein each of said first and second resonator optical cavities are formed of a different bandgap material with said first and second resonators respectively forming detector means for converting an optical signal of one of said different optical frequencies to a corresponding electrical signal.

6. The integrated optical device of claim 4 wherein at least one of said first and second resonator optical cavities is formed of a bandgap material with at least one of said first and second resonators forming emitter means for converting an electrical signal to a corresponding optical signal.

7. The integrated optical device of claim 4 wherein at least one of said optical components comprises a detector means for converting an optical signal of a selected wavelength to a corresponding electrical signal, and at least one of said optical components comprises an emitter means for converting an electrical signal to a corresponding optical signal of selected wavelength.

8. The integrated optical device of claim 7 wherein said detector means further comprises an active semiconductor cavity having a horizontal p-i-n semiconductor structure for photoconductive detection.

9. The integrated optical device of claim 7 wherein said detector means further comprises an active semiconductor cavity comprising intrinsic semiconductor material having ohmic contacts provided at opposite edges of said cavity, wherein said cavity is for photoconductive detection.

10. An integrated optical device for use in communications and computation systems employing signals of optical frequency comprising:
- a plurality of optical components fabricated monolithically in a stack upon a substrate, each of said components processing optical signals;
- wherein said optical components are stacked parallel and intimately adjacent to one another such that they each are aligned with a common optical axis which is substantially perpendicular to the surface forming the top of said stack; and
- wherein at least one of said optical components comprises demodulator means for converting a frequency-modulated optical signal to a corresponding amplitude-modulated electrical signal.

11. The integrated optical device of claim 10 wherein said detector means comprises:
- an active optical cavity having dimensions to permit resonance of an optical signal at selected optical wavelengths; and
- first and second multi-layer mirrors disposed upon opposite ends of said optical cavity for reflecting selected optical wavelengths within said optical cavity, wherein said first and second mirrors form surfaces substantially parallel to one another such that said first and second mirrors together with said optical cavity form a Fabry-Perot resonator.

12. An integrated optical device for use in communications and computation systems employing signals of optical frequency comprising:
- a plurality of optical components fabricated monolithically in a stack upon a substrate, each of said components processing optical signals;
- wherein said optical components are stacked parallel and intimately adjacent to one another such that they each are aligned with a common optical axis which is substantially perpendicular to the surface forming the top of said stack; and
- wherein at least one of said optical components comprises an external grating feedback surface emitting laser for emitting a frequency stabilized optical signal comprising:
- an active optical cavity having dimensions to permit resonance of an optical signal at selected optical wavelengths;
- first and second multi-layer mirrors disposed on opposite ends of said optical cavity for reflecting selected optical wavelengths within said optical cavity, whereby said first and second mirrors form surfaces substantially parallel to one another such that said first and second mirrors together with said optical cavity form a Fabry-Perot resonator; and
- a grating feedback layer parallel and intimately adjacent to one of said first and second mirrors for reflecting a selected optical wavelength into said resonator, said feedback layer having periodically varying index of refraction.

13. The integrated optical device of claim 12 wherein said external grating feedback surface emitting laser further comprises a phase control resonator disposed between said one of said first and second mirrors and said feedback layer where the refractive index of said feedback layer is capable of being electrically changed to control the phase of said generated optical signal.

14. The integrated optical device of claim 12 wherein said external grating feedback surface emitting laser further comprises a tunable coupling layer disposed between said one of said first and second mirrors and said feedback layer, said tunable coupling layer comprising;
- a semiconductor layer having periodically varying index of refraction; and
- means coupled to said semiconductor layer for electronically controlling the index of refraction of said coupling layer.

15. An integrated optical device for use in communications and computation systems employing signals of optical frequency comprising:
- a plurality of optical components fabricated monolithically in a stack upon a substrate, each of said components processing optical signals;
- wherein said optical components are stacked parallel and intimately adjacent to one another such that they each are aligned with a common optical axis which is substantially perpendicular to the surface forming at the top of said stack; and
- wherein at least one of said optical components comprises an optical resonator comprising:
- an optical cavity having dimensions to permit resonance of an optical signal at selected optical wavelengths;
- first and second multi-layer mirrors respectively disposed upon opposite ends of said optical cavity for reflecting selected wavelengths of light within said optical cavity, wherein said multi-layer mirrors form surfaces which are substantially parallel to one another; and
- control means coupled to said first mirror for electrically controlling the index of refraction of said first mirror.

16. An integrated optical device for use in communications and computation systems employing signals of optical frequency comprising:
- a plurality of optical components fabricated monolithically in a stack upon a substrate, each of said components processing optical signals;
- wherein said optical components are stacked parallel and intimately adjacent to one another such that they each are aligned with a common optical axis which is substantially perpendicular to the surface formed at the top of said stack; and
- wherein at least one of said optical components comprises an optical resonator comprising:
- an optical cavity having dimensions to permit resonance of an optical signal at selected optical wavelengths, said optical cavity comprising a plurality of quantum wells formed therein wherein the distance separating said quantum wells varies sinusoidly vertically throughout said optical cavity; and first and second multi-layer mirrors respectively disposed upon opposite ends of said optical cavity for reflecting selected wavelengths of light within said optical cavity, wherein said multi-layer mirrors form surfaces which are substantially parallel to one another.

17. An integrated optical device for use in communications and computation systems employing signals of optical frequency comprising:

a plurality of optical components fabricated monolithically in a stack upon a substrate, each of said components processing optical signals;

wherein said optical components are stacked parallel and intimately adjacent to one another such that they each are aligned with a common optical axis which is substantially perpendicular to the surface forming at the top of said stack;

wherein at least one of said optical components comprises an optical resonator comprising:

an optical cavity having dimensions to permit resonance of an optical signal at selected optical wavelengths, said optical cavity comprising a plurality of quantum wells formed therein wherein groups of a selected number of said quantum wells are evenly spaced vertically throughout said optical cavity and wherein the index of refraction of the regions within said optical cavity separating said groups of quantum wells varies smoothly to a selected value midway between said groups; and first and second multi-layer mirrors respectively disposed upon opposite ends of said optical cavity for reflecting selected wavelengths of light within said optical cavity, wherein said multi-layer mirrors form surfaces which are substantially parallel to one another.

18. An integrated optical device for use in communications and computation systems employing signals of optical frequency comprising:

a plurality of optical components fabricated monolithically in a stack upon a substrate, each of said components processing optical signals;

wherein said optical components are stacked parallel and intimately adjacent to one another such that they each are aligned with a common optical axis which is substantially perpendicular to the surface forming at the top of said stack;

wherein at least one of said optical components comprises an optical resonator comprising:

an optical cavity having dimensions to permit resonance of an optical signal at selected optical wavelengths comprising said optical cavity a plurality of quantum wells formed therein wherein groups of a selected number of said quantum wells are evenly spaced vertically throughout said optical cavity and wherein the index of refraction of regions of said optical cavities separating said quantum wells is different than the refraction index of said quantum wells, and is constant throughout said optical cavity; and first and second multilayer mirrors respectively disposed upon opposite ends of said optical cavity for reflecting selected wavelengths of light within said optical cavity, wherein said multi-layer mirrors form surfaces which are substantially parallel to one another.

* * * * *